(12) United States Patent
Kim

(10) Patent No.: US 8,878,272 B2
(45) Date of Patent: Nov. 4, 2014

(54) SEMICONDUCTOR DEVICE HAVING STACKED STORAGE NODES OF CAPACITORS IN CELL REGION SEPARATED FROM PERIPHERAL REGION

(75) Inventor: Jun Ki Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 310 days.

(21) Appl. No.: 13/337,481

(22) Filed: Dec. 27, 2011

(65) Prior Publication Data

US 2012/0205779 A1     Aug. 16, 2012

(30) Foreign Application Priority Data

Feb. 15, 2011 (KR) .......................... 10-2011-0013457

(51) Int. Cl.
  *H01L 27/108*   (2006.01)
  *H01L 21/02*    (2006.01)
  *H01L 49/02*    (2006.01)
  *H01L 21/768*   (2006.01)

(52) U.S. Cl.
  CPC .... *H01L 27/10852* (2013.01); *H01L 27/10894* (2013.01); *H01L 28/91* (2013.01); *H01L 21/76885* (2013.01); *H01L 21/76895* (2013.01); *H01L 21/76802* (2013.01)
  USPC ........... 257/304; 257/306; 257/307; 257/308; 257/311; 257/532

(58) Field of Classification Search
  None
  See application file for complete search history.

(56) References Cited

U.S. PATENT DOCUMENTS

| 6,794,247 B2 * | 9/2004 | Kwak et al. .................... 438/257 |
| 2009/0090996 A1 * | 4/2009 | Koo .............................. 257/532 |

FOREIGN PATENT DOCUMENTS

KR       100533959 B1    11/2005

* cited by examiner

*Primary Examiner* — Michael Jung
(74) *Attorney, Agent, or Firm* — William Park & Associates Patent Ltd.

(57) ABSTRACT

Methods of fabricating a semiconductor device are provided. The method includes forming a first mold layer on a in a cell region and a peripheral region, forming first storage nodes penetrating the first mold layer in the cell region and a first contact penetrating the first mold layer in the peripheral region, forming a second mold layer on the first mold layer, forming second storage nodes that penetrate the second mold layer to be connected to respective ones of the first storage nodes, removing the second mold layer in the cell and peripheral regions and the first mold layer in the cell region to leave the first mold layer in the peripheral region, and forming a second contact that penetrates a first interlayer insulation layer to be connected to the first contact. Related devices are also provided.

7 Claims, 19 Drawing Sheets

SEMICONDUCTOR DEVICE HAVING STACKED STORAGE NODES OF CAPACITORS IN CELL REGION SEPARATED FROM PERIPHERAL REGION

CROSS-REFERENCES TO RELATED APPLICATIONS

The present application claims priority under 35 U.S.C 119(a) to Korean Application No. 10-2011-0013457, filed on Feb. 15, 2011, in the Korean intellectual property Office, which is incorporated herein by reference in its entirety set forth in full.

BACKGROUND

1. Field of the Invention

Embodiments of the present disclosure relate to semiconductor devices and methods of fabricating the same and, more particularly, to semiconductor devices including capacitors and metal contacts and methods of fabricating the same.

2. Description of the Related Art

Dynamic random access (DRAM) devices employ cell capacitors as data storage elements. A height of cell capacitors has been increased to obtain large cell capacitance in a limited cell array area without degradation of the integration density of the DRAM devices. Cylinder-shaped storage nodes have been widely employed to increase the height of the cell capacitors. The storage nodes may be formed in through holes penetrating a mold layer. However, as a design rule of the DRAM devices reduces, an aspect ratio of the through holes has been increased. Thus, when the height of the cell capacitors increases, it may be difficult to form the through holes completely passing through the mold layer using an etching process. That is, there may be some limitations in forming through holes having a high aspect ratio.

Further, if the height of the storage nodes in a cell array region increases, a height of metal contact holes formed in a peripheral circuit region or a core region may also increase. That is, an aspect ratio of the metal contact holes may also increase. Accordingly, even though an insulation layer is over-etched to form the metal contact holes, the metal contact holes cannot expose underlying conductive patterns. This is due to polymer generated during the etching process for forming the metal contact holes. More specifically, the metal contact holes may be formed to have a sloped sidewall profile because of the polymer. Finally, the metal contact holes may not completely penetrate the mold layer even though the etch time increases. Therefore, the polymer generated during the etching process may cause a process failure in that the metal contact holes do not expose the underlying conductive patterns. This process failure may be referred to hereinafter as "an open fail."

Moreover, when the metal contact holes are misaligned with the underlying conductive patterns, an insulation layer adjacent to the underlying conductive patterns may also be etched to expose undesired conductive patterns during an over etching step of the etching process for forming the metal contact holes. This is because etching time is increased in proportion to the height of the metal contact holes, and thus the over etching time is also increased in proportion of the height of the metal contact holes.

Furthermore, if the aspect ratio of the metal contact holes increases, it may be difficult to fill the metal contact holes with a conductive layer such as a metal layer without any voids therein.

SUMMARY

Embodiments are directed to semiconductor devices having capacitors and metal contact and methods of fabricating the same.

In an embodiment, a method of fabricating a semiconductor device includes forming a first mold layer in a cell region and a peripheral region, forming first storage nodes penetrating the first mold layer in the cell region and a first contact penetrating the first mold layer in the peripheral region, forming a second mold layer on the first mold layer, forming second storage nodes that penetrate the second mold layer to be connected to respective ones of the first storage nodes, removing the second mold layer in the cell and peripheral regions and the first mold layer in the cell region to leave the first mold layer in the peripheral region, and forming a second contact that penetrate a first interlayer insulation layer to be connected to the first contact.

In another embodiment, the method of fabricating a semiconductor device includes forming a first mold layer on a semiconductor substrate having a cell region and a peripheral region, forming first storage nodes penetrating the first mold layer in the cell region, a first contact penetrating the first mold layer in the peripheral region, and a first blocking wall penetrating the first mold layer between the cell and peripheral regions to separate the first mold layer in the cell region from the first mold layer in the peripheral region, forming a second mold layer on the first mold layer, forming second storage nodes that penetrate the second mold layer to be connected to respective ones of the first storage nodes, a second contact that penetrates the second mold layer to be connected to the first contact, and a second blocking wall that penetrates the first mold layer to separate the second mold layer in the cell region from the second mold layer in the peripheral region, selectively removing the first and second mold layers in the cell region to expose outer sidewalls of the first and second storage nodes, sequentially forming a dielectric layer and a plate node to cover the first and second storage nodes, forming a first interlayer insulation layer to cover the plate node and the second mold layer remained in the peripheral region, and forming a third contact that penetrate the first interlayer insulation layer to be connected to the second contact.

The method may further include forming a second interlayer insulation layer between the first mold layer and the semiconductor substrate, forming bit lines in the second interlayer insulation layer in the cell region, forming storage node contacts that penetrate the second interlayer insulation layer to connect the first storage nodes to the semiconductor substrate, and forming a fourth contact that penetrates the second interlayer insulation layer in the peripheral region to be connected to the first contact.

The first blocking wall, the first storage nodes and the first contact may be simultaneously formed of the same material, and the second blocking wall, the second storage nodes and the second contact may be simultaneously formed of the same material.

Forming the first blocking wall, the first storage nodes and the first contact may include forming first through holes penetrating the first mold layer in the cell region, a first contact hole penetrating the first mold layer in the peripheral region, and a first trench penetrating the first mold layer between the cell and peripheral regions to surround the first mold layer in the cell region, forming a first conductive layer to fill the first through holes, the first contact hole, and the first trench, and planarizing the first conductive layer to expose the first mold layer.

The method may further include forming a blocking layer that covers the first blocking wall, the first mold layer and the first contact in the peripheral region and exposes the first mold layer and the first storage nodes in the cell region, prior to formation of the second mold layer. Forming the blocking layer may include forming a silicon nitride layer on the first mold layer and selectively removing the silicon nitride layer in the cell region using an etching process. Forming the second blocking wall, the second storage nodes and the second contact may include forming second through holes penetrating the second mold layer to expose the first storage nodes, a second contact hole penetrating the second mold layer to expose the blocking layer on the first contact, and a second trench penetrating the second mold layer to expose the blocking layer on the first blocking wall, removing the exposed blocking layer to expose the first contact and the first blocking wall, forming a second conductive layer to fill the second through holes exposing the first storage nodes, the second contact hole exposing the first contact, and the second trench exposing the first blocking wall, and planarizing the second conductive layer to expose the second mold layer.

The method may further include forming a floating support layer on the second mold layer to support the second storage nodes. The floating support layer may be formed of a silicon nitride layer. The method may further include forming a capping layer on the floating support layer. The capping layer may be formed of a silicon oxide layer. Forming the second storage nodes may include forming second through holes that penetrate the capping layer, the floating support layer and the second mold layer to expose the first storage nodes, a second contact hole that penetrates the capping layer, the floating support layer and the second mold layer to expose the first contact, and a second trench that penetrates the capping layer, the floating support layer and the second mold layer to expose the first blocking wall, forming a second conductive layer to fill the second through holes, the second contact hole and the second trench, planarizing the second conductive layer to expose the capping layer and to form the second storage nodes, the second contact and the second blocking wall, and patterning the capping layer and the floating support layer to form openings that expose portions of the second mold layer in the cell region.

Selectively removing the first and second mold layers in the cell region may include supplying a wet etchant including hydrofluoric acid to the second mold layer through the openings, and the first and second blocking walls and the floating support layer in the peripheral region may prevent the wet etchant from being supplied to the first and second mold layers in the peripheral region.

In yet another embodiment, the semiconductor device includes a semiconductor substrate having a cell region and a peripheral region, first storage nodes disposed on the semiconductor substrate in the cell region and second storage nodes stacked on respective ones of the first storage nodes, a dielectric layer and a plate node sequentially stacked to cover the first and second storage nodes, a first interlayer insulation layer on the semiconductor substrate in the peripheral region, a first contact penetrating the first interlayer insulation layer to have a same height as the first storage nodes, a blocking wall disposed on the semiconductor substrate in an interfacial region between the cell and peripheral regions to have the same height as the first storage nodes and to separate the first interlayer insulation layer, a blocking layer on the first interlayer insulation layer, a second interlayer insulation layer covering the plate node and extending onto the blocking layer, and a second contact penetrating the second interlayer insulation layer and the blocking layer to be connected to the first contact.

In still another embodiment, the semiconductor device includes first storage nodes disposed in a cell region and second storage nodes stacked on respective ones of the first storage nodes, a first contact penetrating a first interlayer insulation layer to have a same height as the first storage nodes, a first blocking wall disposed on the semiconductor substrate in an interfacial region between the cell and peripheral regions to have the same height as the first storage nodes and to separate the first interlayer insulation layer, a second interlayer insulation layer stacked on the first interlayer insulation layer, a second contact penetrating the second interlayer insulation layer to have a same height as the second storage nodes and to be connected to the first contact, a first blocking wall stacked on the first blocking wall to have the same height as the second storage nodes and to separate the second interlayer insulation layer, a floating support layer covering the second interlayer insulation layer, the floating support layer extending to contact a sidewall of the second blocking wall and to contact outer sidewalls of the second storage nodes, a third interlayer insulation layer covering a plate node and extending onto the blocking walls and the floating support layer, and a third contact penetrating the third interlayer insulation layer to be connected to the second contact.

Each of the first and second blocking walls may include a titanium (Ti) layer, a tantalum (Ta) layer, a tungsten (W) layer, a ruthenium (Ru) layer or a compound material thereof.

The semiconductor device may further include a blocking layer disposed between the first and second interlayer insulation layers. The blocking layer may extend to cover the first blocking wall and may separate the first interlayer insulation layer.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Embodiments will provide methods of obtaining high performance capacitors having large capacitance. The methods may be achieved by forming storage nodes having increased heights in a limited planar area of a substrate in response to reduction of a design rule of semiconductor devices. According to an inventive concept, the method may include forming at least two storage nodes sequentially stacked, and each of the stacked storage nodes may be formed by depositing a mold layer on a substrate, forming a through hole penetrating the mold layer, and forming a storage node in the through hole. Thus, a total height of the stacked storage nodes may be increased. That is, if a height of the individual storage node is reduced and the number of the stacked storage nodes is increased, the total height of the stacked storage nodes may be increased without any open fails of the through holes.

Metal contacts in a core region or a peripheral circuit region may also be formed in a stacked form, like the storage nodes. That is, each of metal contact holes filled with the metal contacts may be formed to have a low aspect ratio without reduction of a total height of the stacked metal contacts. Thus, all the metal contact holes can be successfully formed without any open fails, and misalignment between the metal contact and an underlying conductive pattern can be prevented. In addition, since all the metal contact holes have a low aspect ratio, the metal contact holes may be filled with a conductive layer such as a metal layer without any voids therein.

Figure 1:
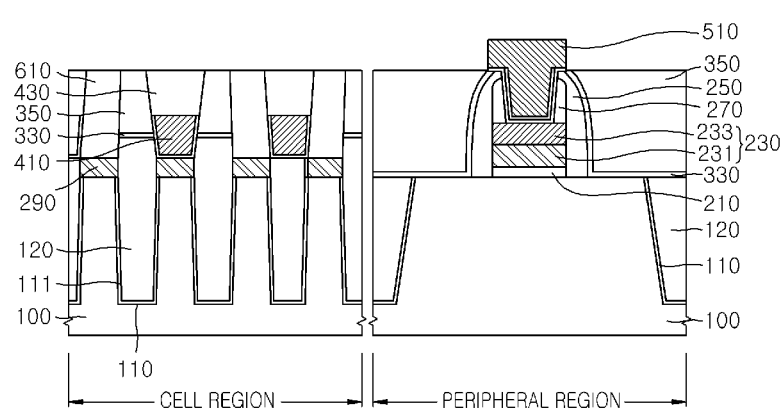
FIGS. 1 to 13 are drawings illustrating a semiconductor device according to a first embodiment and method of fabricating the same.
Figure 2:
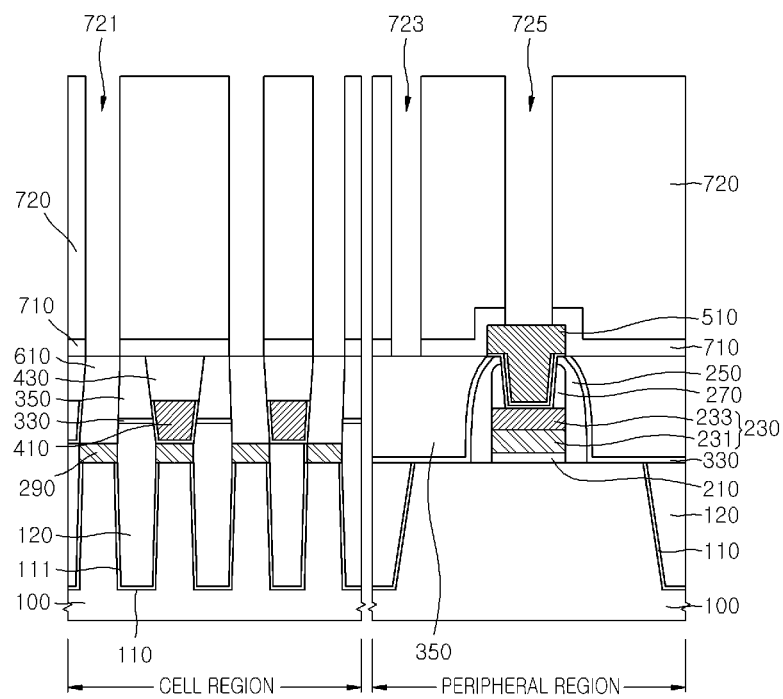
Figure 3:
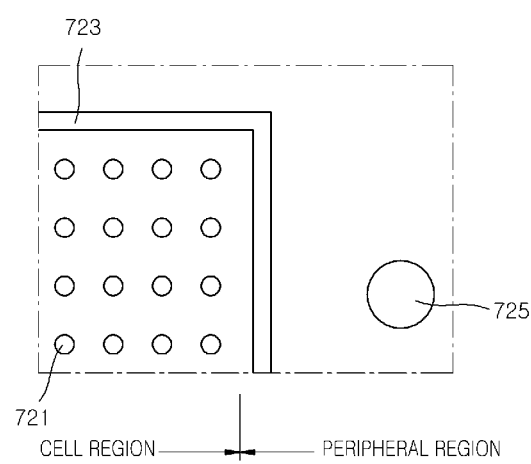

FIGS. 1, 2, and 4 to 13 are cross sectional views illustrating a semiconductor device according to a first embodiment and method of fabricating the same, and FIG. 3 is a plan view illustrating a semiconductor device according to a first embodiment and method of fabricating the same.

Referring to FIG. 1, a field layer 120 may be formed in a substrate 100 such as a silicon wafer to define active regions. Forming the field layer 120 may include forming an isolation trench 110 in the substrate 100 using a shallow trench isolation (STI) technique, sequentially forming a liner 111, a wall oxide layer, a silicon nitride layer (SiN) and a silicon oxide layer (SiO) on an inner surface of the isolation trench 110, and forming a silicon oxide layer that fills the isolation trench 110. In a DRAM device, cell transistors constituting a plurality of memory cells may be formed in and/or on the substrate 100 of a cell region, and interconnections and peripheral transistors constituting peripheral circuits such as sense amplifiers may be formed in and/or on the substrate 100 of a peripheral region. The peripheral region may include a peripheral circuit region and a core region.

Each of the cell transistors may be formed to have a buried gate structure. This is for increasing a channel length of the cell transistors formed in a limited planar cell area. That is, a buried gate constituting the buried gate structure may be formed by etching a portion of the active region to form a gate trench crossing the active region and forming a cell gate in the gate trench. A peripheral gate 230 constituting a peripheral transistor may be formed on the active region in the peripheral region. The peripheral gate 230 may be insulated from the active region by a gate dielectric layer 210. That is, the gate dielectric layer 210 may be formed to intervene between the peripheral gate 230 and the active region in the peripheral region. In an embodiment, the peripheral transistor may be formed after formation of the cell transistors. The peripheral gate 230 may be formed of a double-layered film including a polysilicon layer 231 and a tungsten layer 233 which are sequentially stacked. Alternatively, the peripheral gate 230 may be formed of a metal layer, for example, a titanium nitride (TiN) layer or a tungsten (W) layer. A gate spacer 250 may be formed on a sidewall of the peripheral gate 230, and a gate capping layer 270 may be formed on a top surface of the peripheral gate 230. The gate spacer 250 and the gate capping layer 270 may be formed of an insulation layer such as a silicon nitride layer. The gate capping layer 270 and the gate spacer 250 may be covered with a protection layer 330. The protection layer 330 may be conformably formed in a liner form. The protection layer 330 may be formed of an insulation layer, for example, a silicon nitride layer.

Landing plugs 290 may be formed on the active regions in the cell region. The landing plugs 290 may be formed of a conductive layer such as a polysilicon layer. Some of the landing plugs 290 may act as interconnection contacts that connect some portions of the active regions to bit lines 410.

Further, some of the landing plugs 290 may act as interconnection contacts that connect some portions of the active regions to storage node contacts 610. That is, the bit lines 410 may be electrically connected to drain regions of the cell transistors through some of the landing plugs 290, and the storage node contacts 610 may be electrically connected to source regions of the cell transistors through some of the landing plugs 290.

A first interlayer insulation layer 350 may be formed on the substrate including the landing plugs 290 and the peripheral gate 230. The first interlayer insulation layer 350 may be formed to include an insulation layer such as a silicon oxide layer. The aforementioned bit lines 410 may be formed in the first interlayer insulation layer 350 using a damascene process. The bit lines 410 may be formed to be electrically connected to some of the landing plugs 290. For example, forming the bit lines 410 may include patterning the first interlayer insulation layer 350 to form damascene trenches exposing some of the landing plugs 290, forming a titanium nitride layer acting as a barrier metal layer on the substrate including the damascene trenches, forming a tungsten layer on the barrier metal layer, and etching back the tungsten layer and the tungsten layer. Bit line spacers (not shown) may be additionally formed on sidewalls of the bit lines 410. The bit line spacers may be formed to electrically insulate the bit lines 410 from the storage node contacts 610 laterally adjacent to the bit lines 410. Bit line capping layers 430 may be formed on respective ones of the bit lines 410. The bit line capping layers 430 may be formed of an insulation layer such as a silicon nitride layer. The aforementioned storage node contacts 610 may be then formed in the first interlayer insulation layer 350 of the cell region using a self-aligned contact process. The storage node contacts 610 may be formed to be electrically connected to some of the landing plugs 290.

A first metal contact 510 may be formed on the substrate including of the bit lines 410 and the storage node contacts 610. Forming the first metal contact 510 may include forming a contact hole that exposes the peripheral gate 230, sequentially forming a barrier metal layer and a metal layer on the substrate including the contact hole, and etching back or patterning the metal layer and the barrier metal layer to leave a portion of the metal layer in the contact hole. While the first metal contact 510 is formed, interconnection lines (not shown) may also be formed on the first interlayer insulation layer 350 of the peripheral region. The interconnection lines may constitute a peripheral circuit such as a sense amplifier.

Referring to FIG. 2, an etch stop layer 710 may be formed on the first interlayer insulation layer 350, the first metal contact 510, the storage node contacts 610 and the bit line capping layers 430. The etch stop layer 710 may be formed of an insulation layer having an etch selectivity with respect to a silicon oxide layer. For example, the etch stop layer 710 may be formed of a silicon nitride layer. The etch stop layer 710 may prevent the first interlayer insulation layer 350 from being damaged during a subsequent etching process for forming storage nodes and may provide an end point of the etching process. The etch stop layer 710 may be formed to a thickness of about 200 angstroms (Å) to about 1000 angstroms (Å). A first mold layer 720 may be formed on the etch stop layer 710. The first mold layer 720 may be used to define a shape of the storage nodes. The etch stop layer 710 may provide an end point of an etching process for patterning the first mold layer 720.

The first mold layer 720 may be patterned to form first through holes 721 exposing respective ones of the storage node contacts 610. The first through holes 721 may be formed to define a shape of storage nodes. The first mold layer 720 may be formed by sequentially stacking a plurality of insulation layers having different etch rates. This is for preventing the first through holes 721 from not opening even through a thickness of the first mold layer 720 increases. For example, the first mold layer 720 may be formed by sequentially stacking a phosphor silicate glass (PSG) layer having a relatively high etch rate and a plasma enhanced tetra-ethyl-othor-silicate (PE-TEOS) layer having a relatively low etch rate. Alternatively, the first mold layer 720 may be formed of a single-layered film, for example, a PSG layer or a PE-TEOS layer. A thickness of the first mold layer 720 may be determined in consideration of an aspect ratio and a size of each of the first through holes 721 and an etching process used in formation of the first through holes 721. In an embodiment, the first mold layer 720 may be formed to a thickness of about 10000 angstroms (Å) to about 14000 angstroms (Å).

Each of the first through holes 721 may penetrate the first mold layer 720 and the etch stop layer 710 to expose one of the storage node contacts 610. Forming the first through holes 721 may include forming an etch mask (not shown) such as a hard mask or a photoresist pattern on the first mold layer 720 using a photolithography process or an etching process and dry-etching the first mold layer 720 exposed by the etch mask. While the first through holes 721 are formed, a second contact hole 725 penetrating the first mold layer 720 and the etch stop layer 710 may also be formed to expose the first metal contact 510 in the peripheral region. Further, as illustrated in FIGS. 2 and 3, a first trench 723 penetrating the first mold layer 720 and the etch stop layer 710 may be formed to separate the first mold layer 720 in the cell region from the first mold layer 720 in the peripheral region while the first through holes 721 are formed. That is, the first trench 723 may be formed to surround the first mold layer 720 in the cell region when viewed from a plan view.

Figure 4:
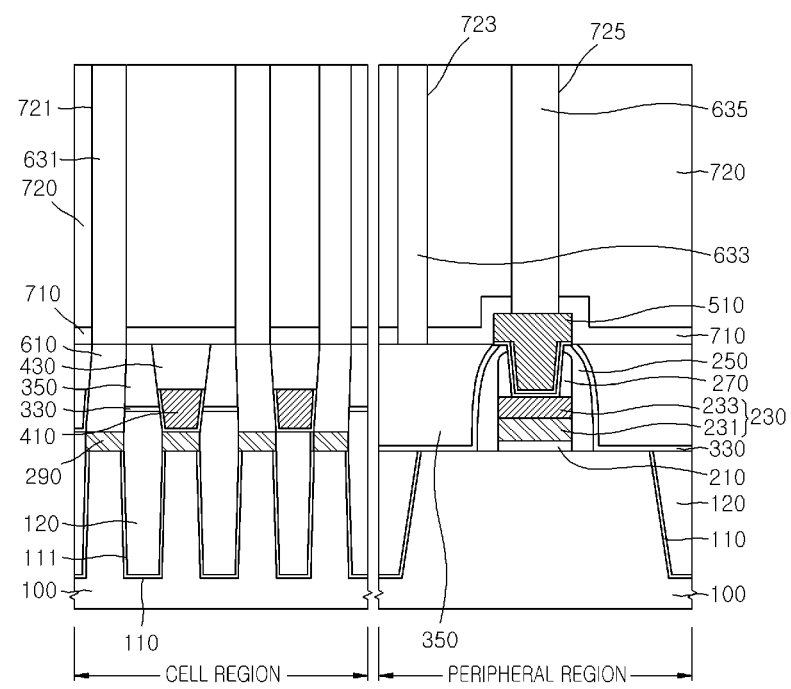

Referring to FIG. 4, a first conductive layer may be deposited to fill the first through holes 721, the second contact hole 725 and the first trench 723. The first conductive layer may be then planarized to form first storage nodes 631 in respective ones of the first through holes 721, a second metal contact 635 in the second contact hole 725 and a first blocking wall 633 in the first trench 723. The planarization process may be performed using an etch back process or a chemical mechanical polishing (CMP) process. The first conductive layer may be formed by depositing a conductive layer, for example, a titanium (Ti) layer, a tantalum (Ta) layer, a tungsten (W) layer, a ruthenium (Ru) layer or a compound material thereof (e.g., a titanium nitride (TiN) layer).

Figure 5:
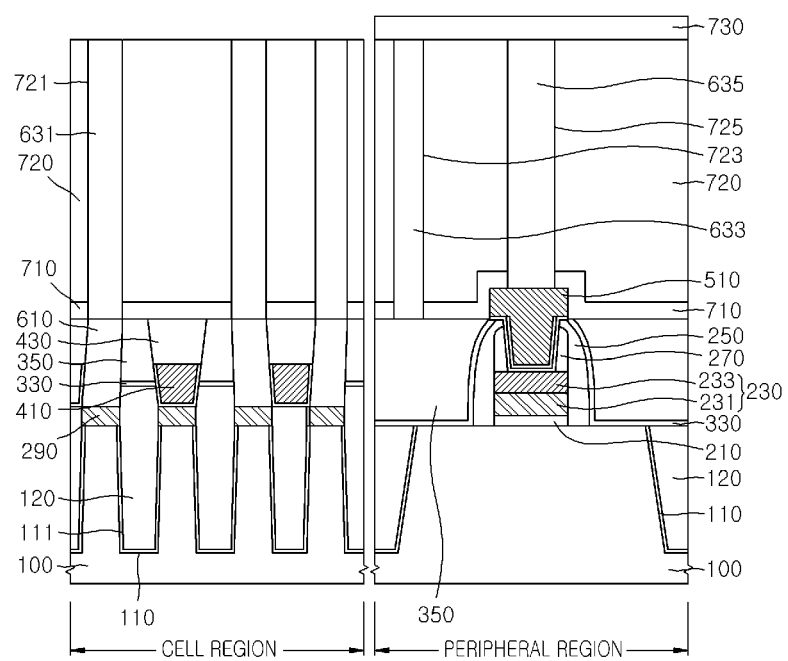

Referring to FIG. 5, a blocking layer 730 may be formed to cover the first mold layer 720 and the second metal contact 635 in the peripheral region. That is, the blocking layer 730 may be formed to expose the first mold layer 720 and the first storage nodes 631 in the cell region. The blocking layer 730 may be formed of an insulation layer that has an etch selectivity with respect to a silicon oxide layer to protect the first mold layer 720 in the peripheral region. For example, the blocking layer 730 may be formed of a silicon nitride layer. The blocking layer 730 in the cell region may be removed using a photolithography process and an etching process. The blocking layer 730 may be formed to overlap with the first blocking wall 633. The blocking layer 730 and the first blocking wall 633 may completely separate the first mold layer 720 in the cell region from the first mold layer 720 in the peripheral region.

Figure 6:
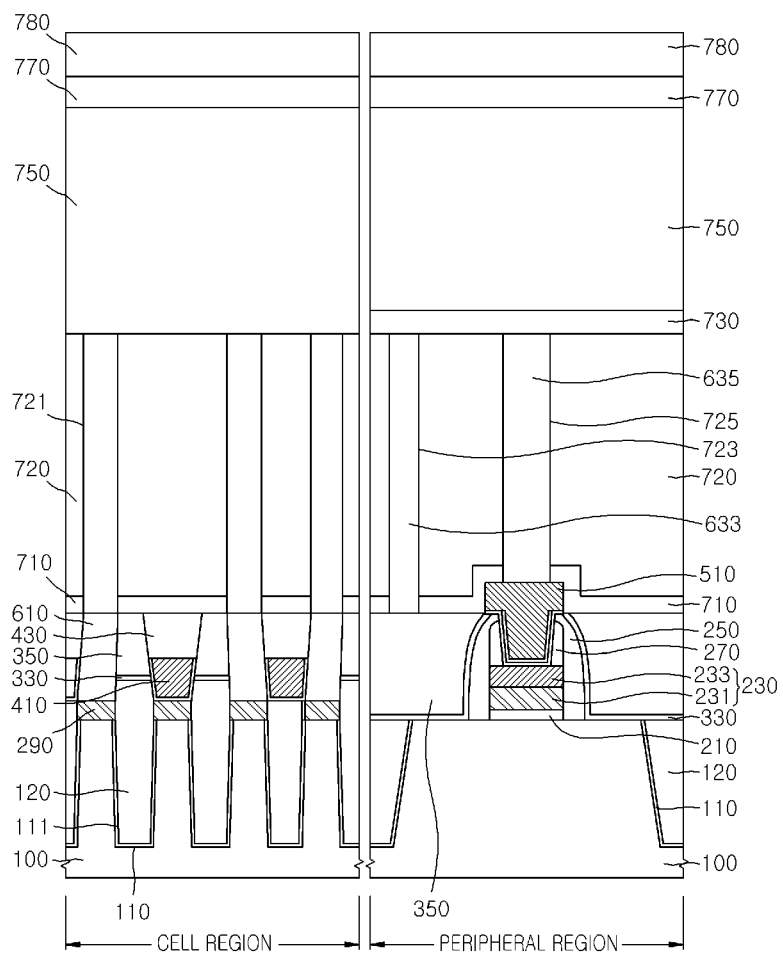

Referring to FIG. 6, a second mold layer 750 may be formed to cover the first mold layer 720 in the cell region and the blocking layer 730 in the peripheral region. The second mold layer 750 may be formed in a substantially similar manner as the first mold layer 720, that is the second mold layer 750 may be formed by sequentially stacking a plurality of insulation layers having different etch rates. This is for preventing second through holes 751 (see FIG. 7) formed to penetrate the second mold layer 750 in a subsequent process from not opening even though a thickness of the second mold layer 750 increases. For example, the second mold layer 750 may be formed by sequentially stacking a phosphor silicate glass (PSG) layer having a relatively high etch rate and a plasma enhanced tetra-ethyl-othor-silicate (PE-TEOS) layer having a relatively low etch rate. Alternatively, the second mold layer 750 may be formed of a single-layered film, for example, a PSG layer or a PE-TEOS layer. A thickness of the second mold layer 750 may be determined in consideration of an aspect ratio and a size of each of the second through holes and an etching process used in formation of the second through holes. In an embodiment, the second mold layer 750 may be formed to a thickness of about 10000 angstroms (Å) to about 14000 angstroms (Å).

A floating support layer 770 may be formed on the second mold layer 750. The floating support layer 770 may be formed to prevent storage nodes formed in a subsequent process from leaning. The floating support layer 770 may be formed to include an insulation layer having an etch selectivity with respect to the second mold layer 750. For example, the floating support layer 770 may be formed to include a silicon nitride ($Si_3N_4$) layer. A capping layer 780 may be formed on the floating support layer 770. The capping layer 780 may be formed to protect the floating support layer 770 during subsequent etching processes. The capping layer 780 may be formed to include a silicon oxide ($SiO_2$) layer.

Figure 7:
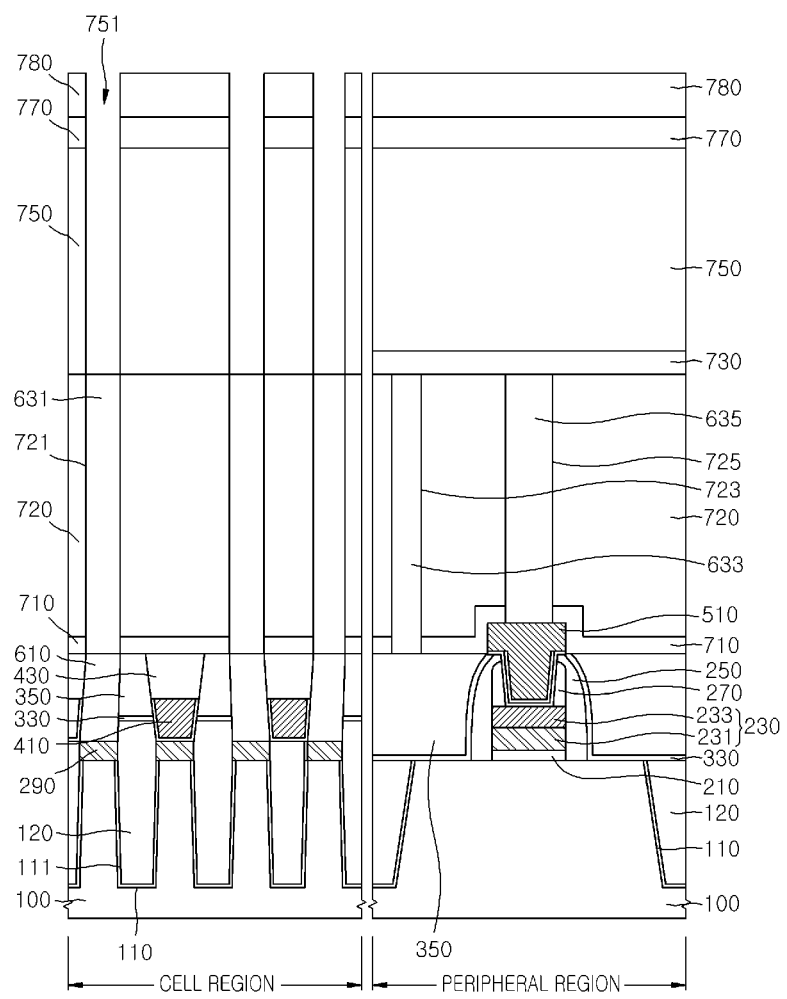

Referring to FIG. 7, the capping layer 780, the floating support layer 770 and the second mold layer 750 may be patterned to form second through holes 751 exposing respective ones of the first storage nodes 631. The second through holes 751 may be formed using a selective etching process.

Figure 8:
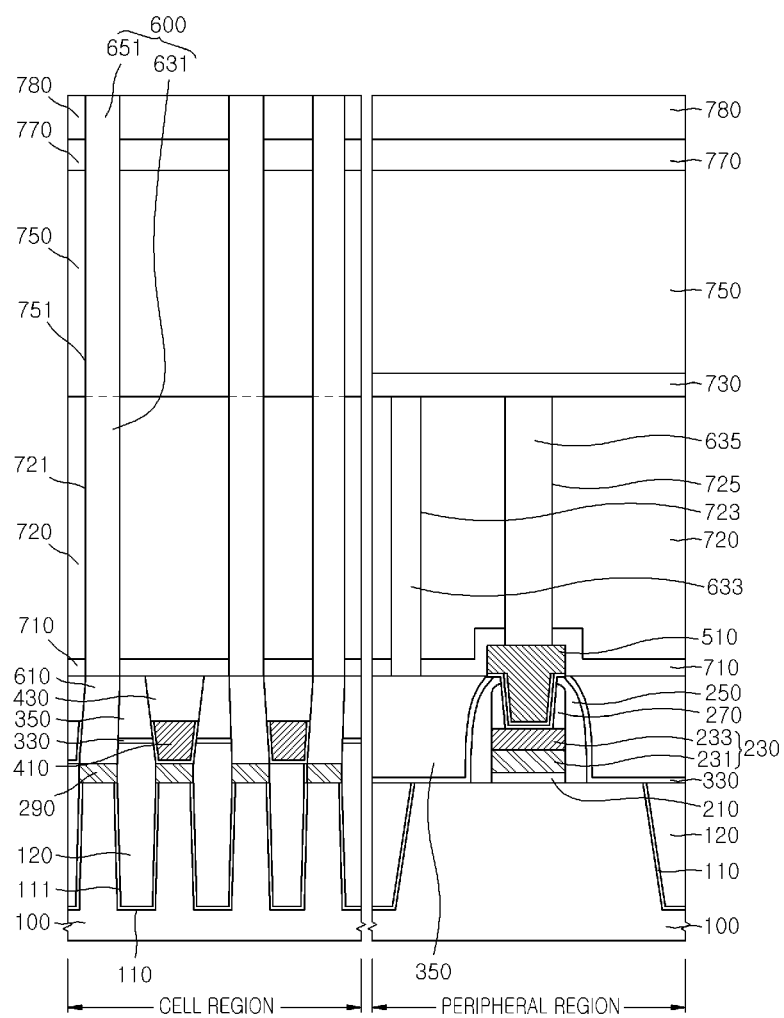

Referring to FIG. 8, a second conductive layer may be deposited to fill the second through holes 751, and the second conductive layer may be planarized to form second storage nodes 651 in respective ones of the second through holes 751. The planarization process applied to the second conductive layer may separate the second storage nodes 651 from each other. The planarization process may be performed using an etch back process or a chemical mechanical polishing (CMP) process. The second conductive layer may be formed by depositing a titanium (Ti) layer, a tantalum (Ta) layer, a tungsten (W) layer, a ruthenium (Ru) layer or a compound material thereof (e.g., a titanium nitride (TiN) layer). The second storage nodes 651 may be stacked on respective ones of the first storage nodes 631. The first storage nodes 631 and the second storage nodes 651 may constitute a plurality of storage nodes 600. That is, each of the storage nodes 600 may include one of the first storage nodes 631 and one of the second storage nodes 651 which are sequentially stacked. In other words, each of the storage nodes 600 may be formed to have a pillar shape. Thus, the storage nodes 600 may be formed to have a height which is equal to at least two times the thickness of the first or second mold layer 720 or 750. Each of the storage nodes 600 may be divided into the first and second storage nodes 631 and 651. That is, each of the storage nodes 600 may be formed to have a stacked structure. Thus, if the number of the stacked mold layers is increased, a total height of the storage nodes 600 may also be increased even without increase of the thickness of each of the stacked mold layers. As a result, the height of the storage nodes 600 may also be increased without open fail of the through holes 721 and 751.

Cylinder-shaped storage nodes have been widely used to increase capacitance in a limited area and height. However, when the storage nodes are formed to have the cylindrical shape, it may be difficult to increase the height of the cylinder-shaped storage nodes because of overhangs. In contrast, according to an embodiment, the storage nodes 600 may be formed to have a pillar shape. Thus, there may be no limitations in increasing the height of the storage nodes 600.

Figure 9:
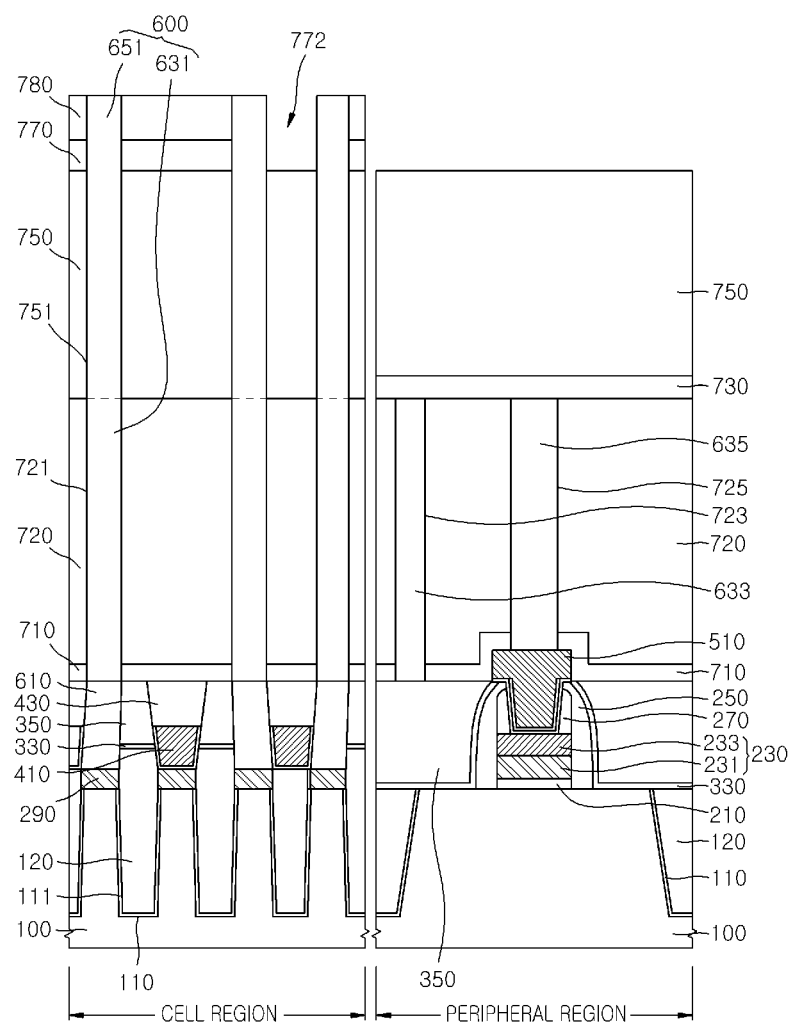

Referring to FIG. 9, the capping layer 780 and the floating support layer 770 may be patterned to form openings 772 that expose portions of the second mold layer 750. The openings 772 may be formed in the cell region, and the capping layer 780 and the floating support layer 770 in the peripheral region may be removed while the openings 772 are formed. The openings 772 may act as inlets of etchant supplied during a subsequent etching process for removing the first and second mold layers 720 and 750 in the cell region to expose sidewalls of the storage nodes 600.

Figure 10:
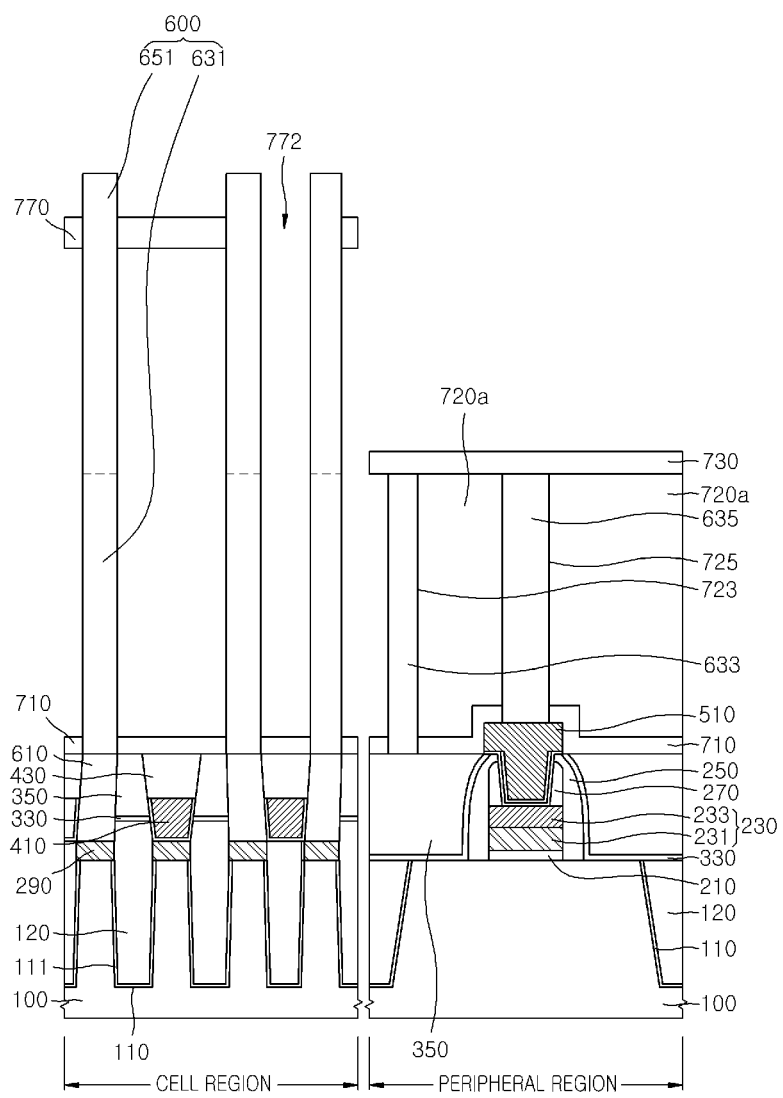

Referring to FIG. 10, the second mold layer 750 and the first mold layer 720 in the cell region may be removed using a wet etching process. The second mold layer 750 in the peripheral region may also be removed while the first and second mold layers 720 and 750 in the cell region are removed. The wet etching process for removing the second mold layer 750 and the first mold layer 720 may be performed using a wet etchant, for example, a buffer oxide etchant (BOE) or a diluted hydrogen fluoride (HF) solution. The wet etchant may be introduced through the openings 772 to remove the second mold layer 750 and the first mold layer 720 in the cell region. That is, the openings 772 may act as inlets of the wet etchant supplied during the wet etching process for removing the first and second mold layers 720 and 750 in the cell region. Further, the openings 772 may be used as inlets of source materials supplied when a dielectric layer and a plate node are formed in subsequent processes. As a result of removal of the first and second mold layers 720 and 750 in the cell region, outer sidewalls of the storage nodes 600 may be exposed.

The first mold layer 720 in the peripheral region is surrounded and isolated by the blocking layer 730 and the first blocking wall 633. Thus, even though the wet etching process for removing the first and second mold layers 720 and 750 in the cell region is performed, the first mold layer 720 in the peripheral region may still remain without any etch damage. The first mold layer 720 in the peripheral region may act as a second interlayer insulation layer 720a that electrically insulates the second metal contact 635.

Figure 11:
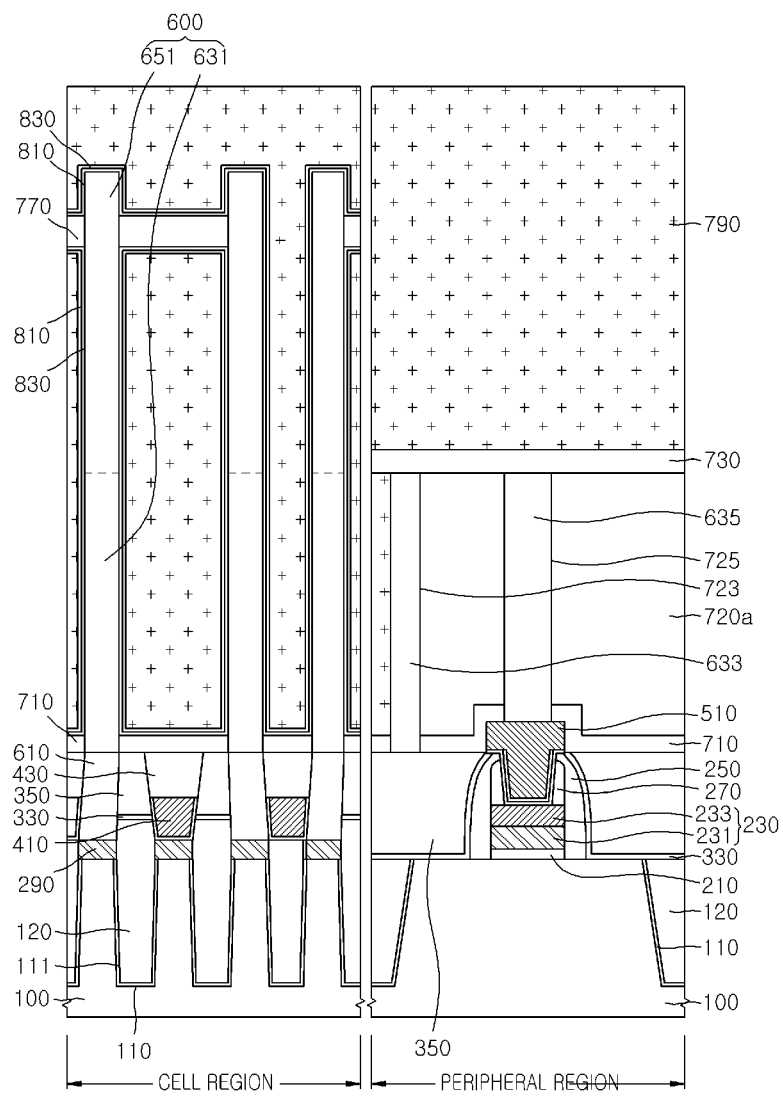

Referring to FIG. 11, deposition source materials may be supplied through the openings 772 to form a dielectric layer 810 on the outer sidewalls of the storage nodes 600 and a plate node 830 on the dielectric layer 810. The plate node 830 formed in the peripheral region may be then removed. As such, cell capacitors may be formed to include the pillar-shaped storage nodes 600 and to have increased capacitance with the high storage nodes 600. The dielectric layer 810 may be formed by depositing a high-k dielectric material such as a zirconium oxide ($ZrO_2$) material, and the plate node 830 may be formed of a noble metal layer (e.g., a ruthenium layer), a doped polysilicon layer or a combination thereof.

Subsequently, a third interlayer insulation layer 790 may be formed on the substrate including the plate node 830. The third interlayer insulation layer 790 may be formed of a silicon oxide layer. The third interlayer insulation layer 790 may extend to cover the blocking layer 730 in the peripheral region.

Figure 12:
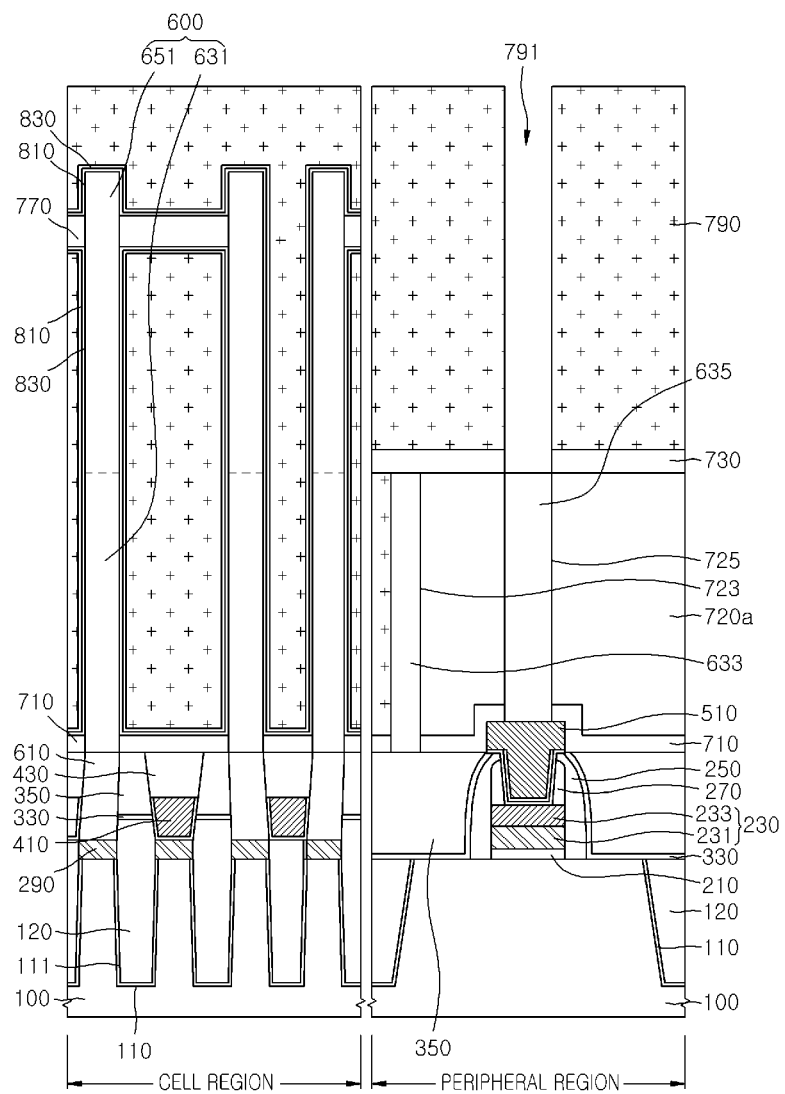

Referring to FIG. 12, the third interlayer insulation layer 790 and the blocking layer 730 may be patterned to form a second contact hole 791 exposing the second metal contact 635. The second contact hole 791 may be formed using an etching process.

Figure 13:
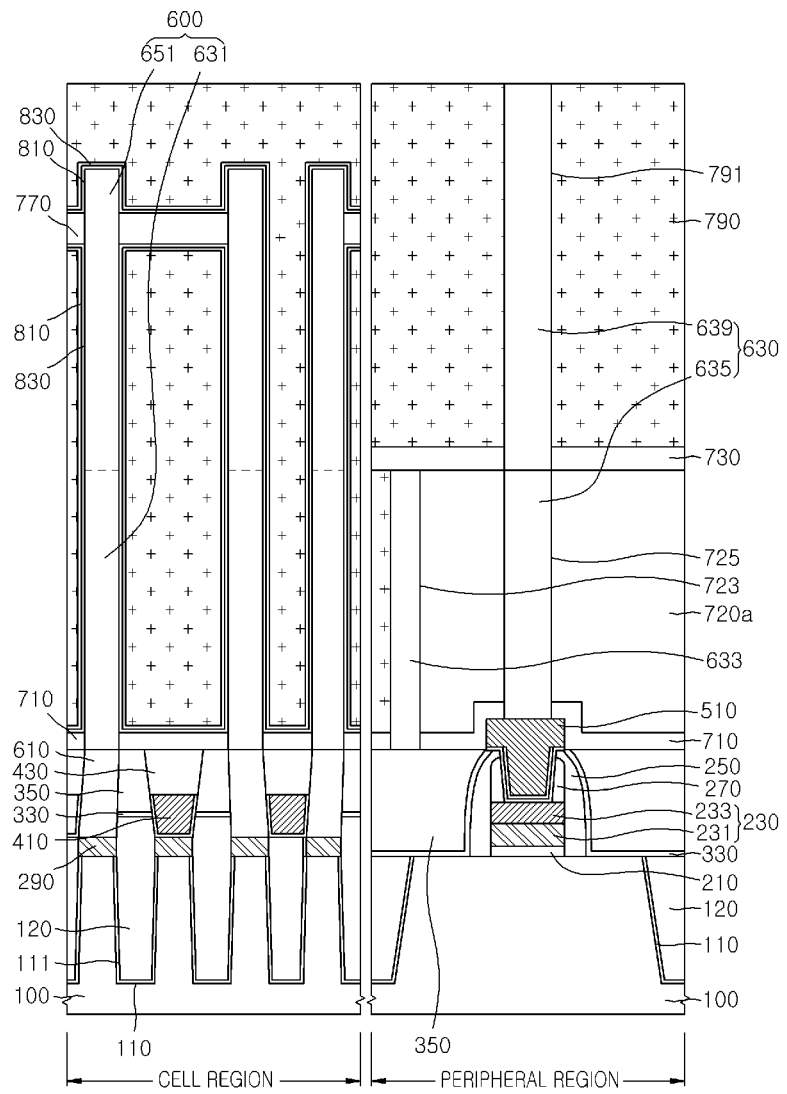

Referring to FIG. 13, a conductive layer, for example, a metal layer such as a tungsten layer may be formed to fill the second contact hole 791, and the conductive layer may be planarized to form a third metal contact 639 in the second contact hole 791. Thus, the third metal contact 639 may be stacked on the second metal contact 635. The second and third metal contacts 635 and 639 may constitute a metal contact 630. The metal contact 630 may be formed to have a stacked structure including a plurality of stacked contacts, even though the height of the storage nodes 600 increases. Thus, each of the contact holes 725 and 791 penetrating the interlayer insulation layers 720a and 790 may be formed to have a relatively low aspect ratio. Accordingly, the contact hole 725 and 791 may be formed without any open fail. Further, since the contact holes 725 and 791 penetrating the interlayer insulation layers 720a and 790 may be formed to have a relatively low aspect ratio, alignment margin of the contact holes 725 and 791 may be improved.

According to an embodiment described above, a height (or a depth) of each of the stacked contact holes may be reduced to solve the open fail and the misalignment of the contact holes. Thus, each of the contact holes may be completely filled with a conductive layer, or the conductive layer may be conformably formed in the contact holes with a uniform thickness to improve a step coverage of the conductive layer.

FIGS. 14 to 18 are cross sectional views illustrating a semiconductor device according to a second embodiment and method of fabricating the same.

Figure 14:
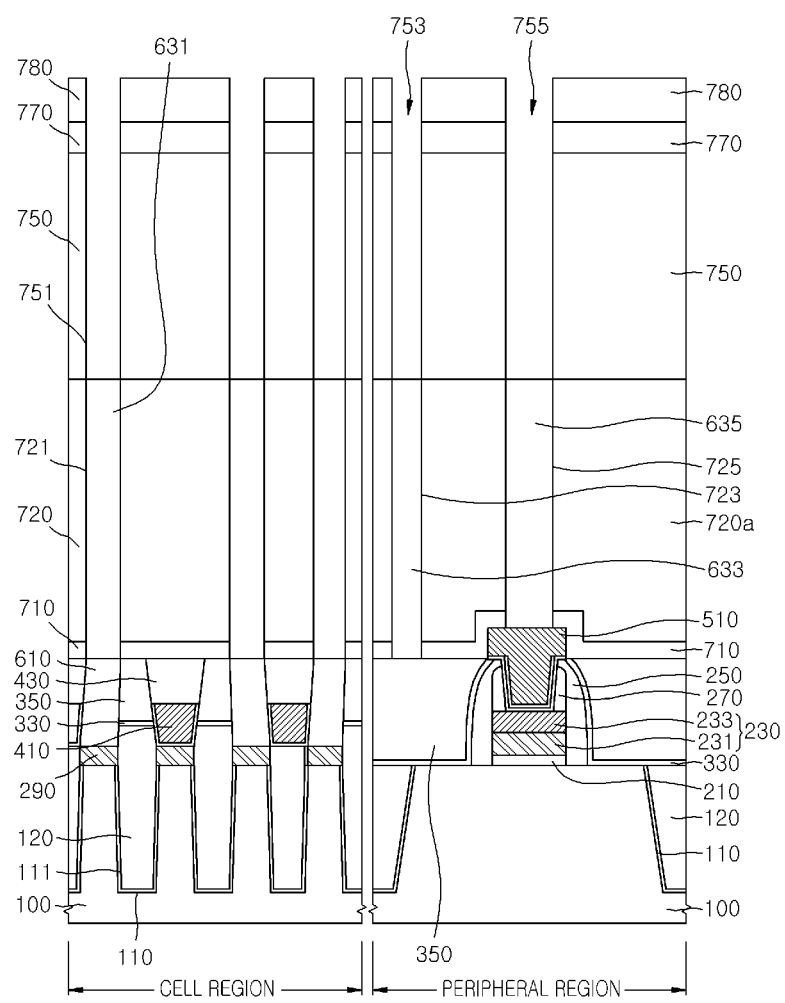
FIGS. 14 to 18 are cross sectional views illustrating a semiconductor device according to a second embodiment and method of fabricating the same.

Referring to FIG. 14, in substantially the manner as described with reference to FIG. 4, first storage nodes 631, a second metal contact 635 and a first blocking wall 633 may be formed to fill first through holes 721, a second contact hole 725 and a first trench 723, respectively. Subsequently, a second mold layer 750, a floating support layer 770, a capping layer 780 and second through holes 751 may be formed in substantially the same manner as described with reference to FIGS. 7 and 8. While the second through holes 751 are formed, the second mold layer 750, the floating support layer 770 and the capping layer 780 in the peripheral region may also be patterned to form a third contact hole 755 exposing the second metal contact 635 and a second trench 753 exposing the first blocking wall 633.

Figure 15:
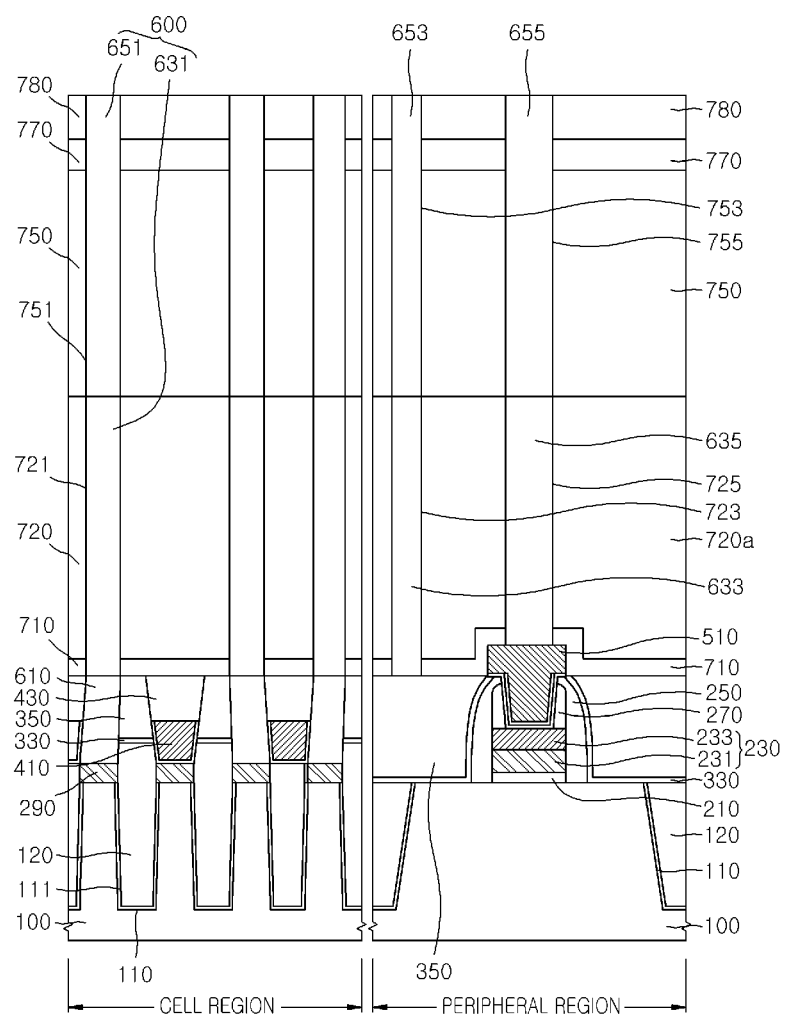

Referring to FIG. 15, second storage nodes 651 filling the second through holes 751 may be formed in substantially the same manner as described with reference to FIG. 8. While the second storage nodes 651 are formed, a second blocking wall 653 and a fourth metal contact 655 may also be formed to fill the second trench 753 and the third contact hole 755, respectively. The first storage nodes 631 and the second storage nodes 651—where the second storage nodes 651 may be stacked on the first storage nodes 631—may constitute a plurality of storage nodes 600. That is, each of the storage nodes 600 may include one of the first storage node 631 and one of the second storage node 651 which are sequentially stacked.

Figure 16:
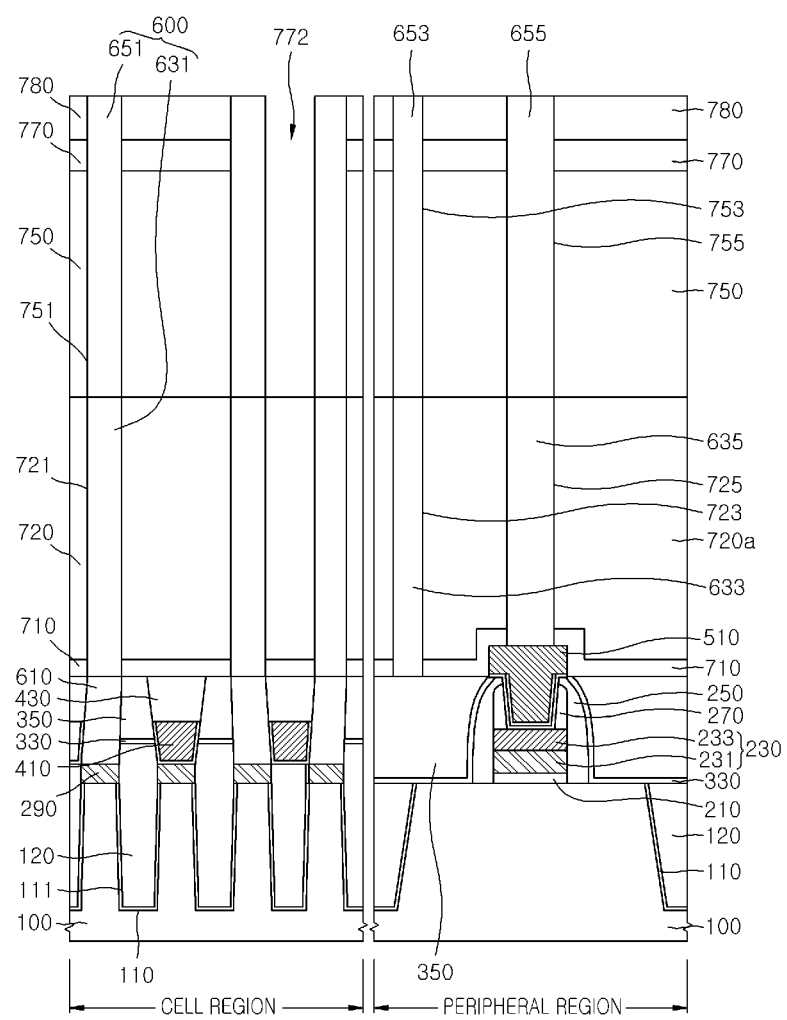

Referring to FIG. 16, the floating support layer 770 and the capping layer 780 may be patterned to form openings 772 that expose portions of the second mold layer 750, in substantially the same manner as described with reference to FIG. 9. The openings 772 may be formed in the cell region, and the capping layer 780 and the floating support layer 770 in the peripheral region may remain while the openings 772 are formed. The openings 772 may act as inlets of etchant supplied during a subsequent etching process for removing the first and second mold layers 720 and 750 in the cell region to expose sidewalls of the storage nodes 600.

Figure 17:
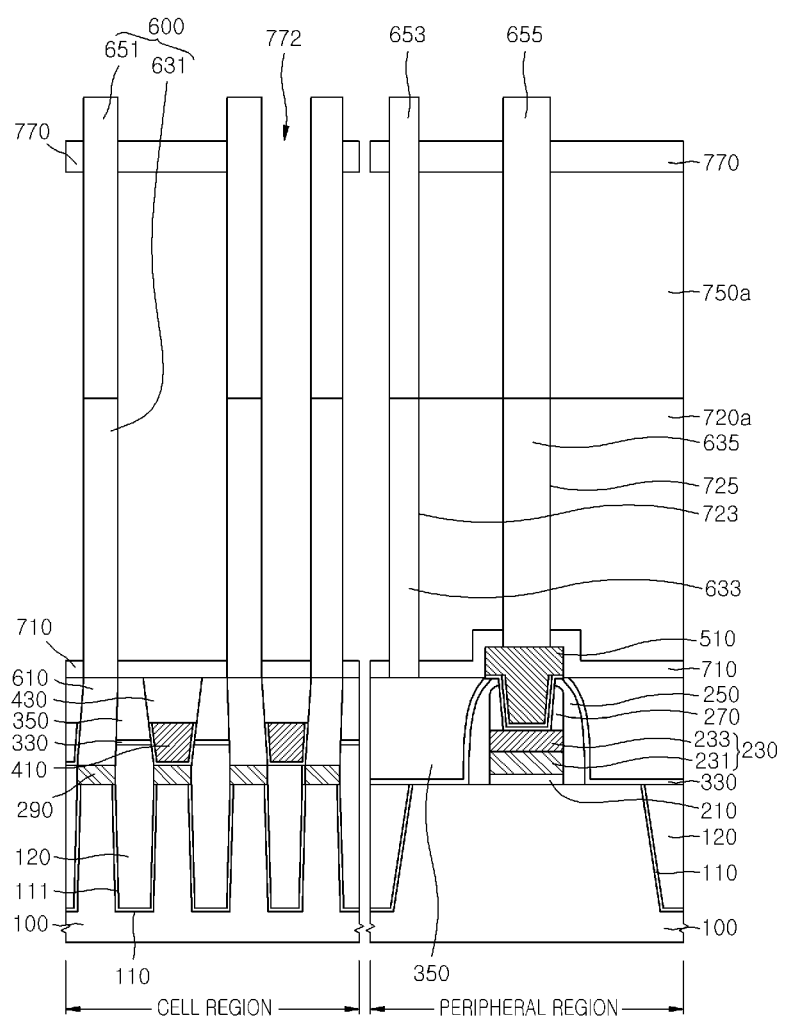

Referring to FIG. 17, the second mold layer 750 and the first mold layer 720 in the cell region may be removed using a wet etching process, in substantially the same manner as described with reference to FIG. 10. The first and second blocking walls 633 and 653 may isolate the first and second mold layers 720 and 750 in the cell region from the first and second mold layers 720 and 750 in the peripheral region. Further, the floating support layer 770 in the peripheral region may cover the second mold layer 750 in the peripheral region and the second blocking wall 653. Thus, while the wet etching process is performed to remove the second mold layer 750 and the first mold layer 720 in the cell region, the first and second mold layers 720 and 750 in the peripheral region may still remain to function as second and third interlayer insulation layers 720*a* and 750*a*, respectively.

Figure 18:
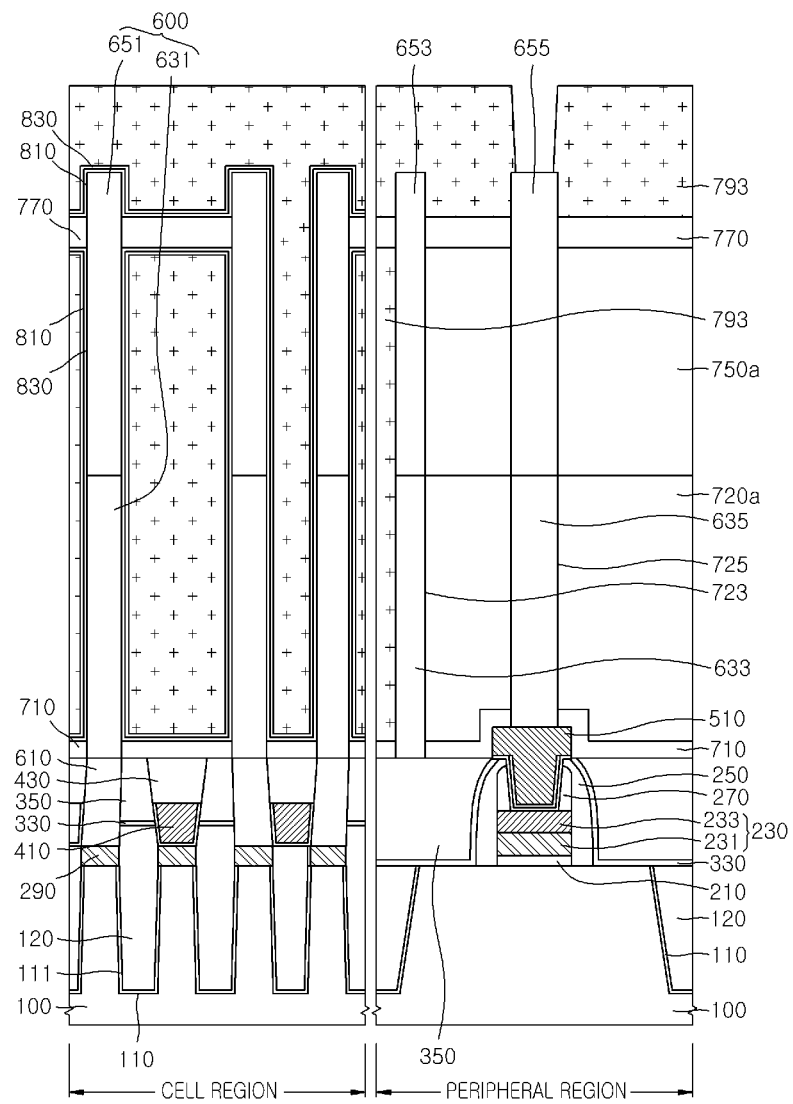

Referring to FIG. 18, deposition source materials may be supplied through the openings 772 to form a dielectric layer 810 on outer sidewalls of the storage nodes 600 and a plate node 830 on the dielectric layer 810, in substantially the same manner as described with reference to FIG. 11. Subsequently, a fifth interlayer insulation layer 793 may be formed on the substrate including the plate node 830. The fifth interlayer insulation layer 793 may be formed of a silicon oxide layer. The fifth interlayer insulation layer 793 may extend to cover and insulate the second blocking wall 653 and the fourth metal contact 655 in the peripheral region.

The fifth interlayer insulation layer 793 may be patterned to form a contact hole exposing the fourth metal contact 655, and a fifth metal contact 656 (see FIG. 19) may be formed to fill the contact hole. The second, fourth and fifth metal contacts 633, 655 and 656 may constitute a metal contact. According to the present embodiment, the number of the stacked metal contacts is increased as compared with the first embodiment. Thus, a height of each of the stacked metal contacts may be reduced without an increase of a total height of the stacked metal contacts. As a result, process fails, for example, open fails of contact holes and/or misalignment problems between the stacked metal contacts can be prevented.

Figure 19:
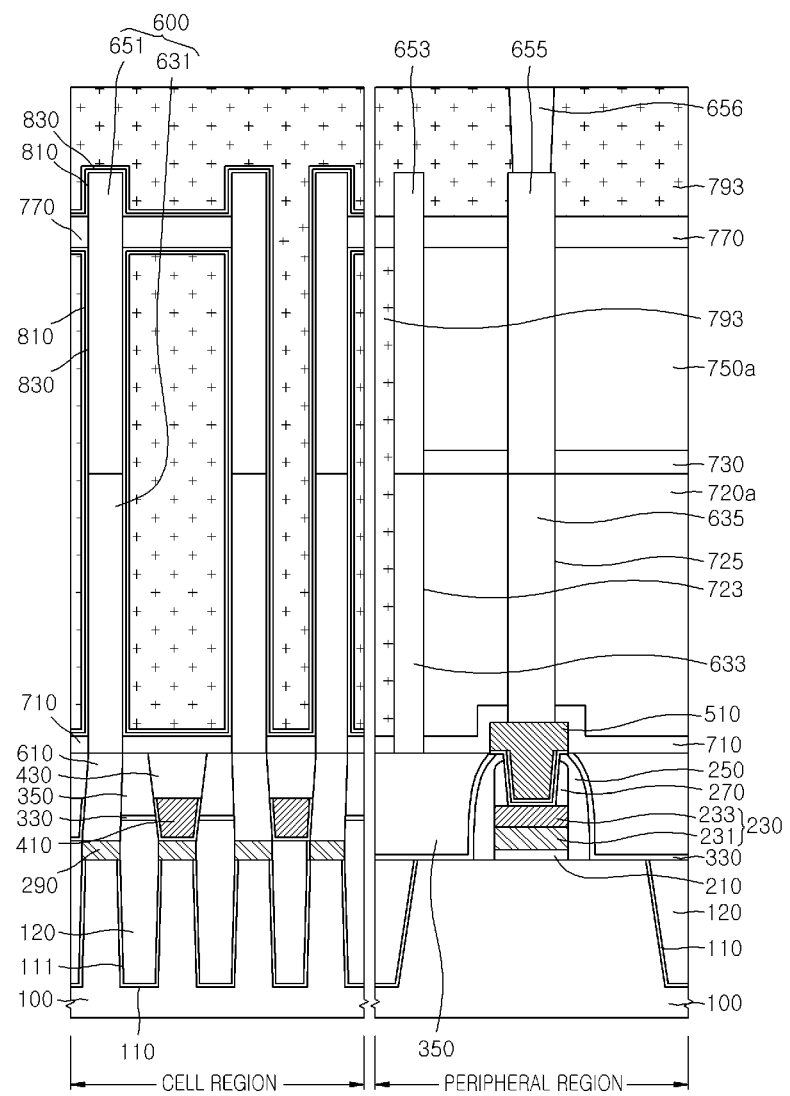
FIG. 19 is a cross sectional view illustrating a semiconductor device according to a third embodiment and method of fabricating the same.

FIG. 19 is a cross sectional view illustrating a semiconductor device according to a third embodiment and method of fabricating the same.

Referring to FIG. 19, a blocking layer 730 may be provided between the second and fourth interlayer insulation layers 720*a* and 750*a* described with reference to FIGS. 14 to 18. In this case, even though the first and second blocking walls 633 and 653 are misaligned with each other, the blocking layer 730 may prevent the wet etchant for removing the first and second mold layers 720 and 750 (corresponding to the second and fourth interlayer insulation layers 720*a* and 750*a*) in the cell region from being supplied to the second and fourth interlayer insulation layers 720*a* and 750*a* in the peripheral region. The blocking layer 730 may be formed of a silicon nitride layer, as described with reference to FIG. 5. The blocking layer 730 may extend to cover a top portion of the first blocking wall 633. Thus, the second interlayer insulation layer 720*a* in the peripheral region can be more clearly isolated because of the presence of the blocking layer 730. Further, the blocking layer 730 may extend to overlap with a lower portion of the second blocking wall 653. Thus, the fourth interlayer insulation layer 750*a* in the peripheral region can be more clearly isolated because of the presence of the blocking layer 730. Accordingly, even while the first and second mold layers 720 and 750 in the cell region are removed to expose the outer sidewalls of the storage nodes 600, the second and fourth interlayer insulation layers 720*a* and 750*a* in the peripheral region may still remain to function as an interlayer insulation layer of the peripheral region.

According to the embodiments set forth above, a stacked storage node of a capacitor may be formed by repeatedly stacking a plurality of mold layers and a plurality of storage nodes penetrating respective ones of the mold layers. Thus, when a thickness of each of the mold layers is reduced and the number of the stacked mold layers is increased, a total height of the stacked storage nodes can be increased even without increase of an aspect ratio of a through hole penetrating each of the mold layers. Accordingly, a total surface area of the stacked storage nodes may be increased to obtain a large capacitance without any open fails of the through holes. Further, a metal contact adjacent to the stacked storage nodes may also be formed by repeatedly stacking the plurality of mold layers and a plurality of metal contacts penetrating respective ones of the mold layers. Thus, when a thickness of each of the mold layers is reduced and the number of the stacked mold layers is increased, a total height of the stacked metal contacts can be increased even without increase of an aspect ratio of a contact hole penetrating each of the mold layers. Accordingly, process fails, for example, open fails of the contact holes and/or misalignment problems between the stacked metal contacts can be prevented.

The embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor device comprising:
   a semiconductor substrate having a cell region and a peripheral region;
   first storage nodes disposed on the semiconductor substrate in the cell region and second storage nodes stacked on respective ones of the first storage nodes;
   a dielectric layer and a plate node sequentially stacked to cover the first and second storage nodes;
   a first interlayer insulation layer on the peripheral region;
   a first contact penetrating the first interlayer insulation layer to have a same height as the first storage nodes;
   a first blocking wall disposed in an interfacial region between the cell and peripheral regions to have the same height as the first storage nodes and to separate the first interlayer insulation layer;
   a second interlayer insulation layer stacked on the first interlayer insulation layer;
   a second contact penetrating the second interlayer insulation layer to have a same height as the second storage nodes and to be connected to the first contact;
   a blocking layer between the first interlayer insulation layer and the second interlayer insulation layer to separate the first interlayer insulation layer;
   a second blocking wall stacked on the first blocking wall to have the same height as the second storage nodes and to separate the second interlayer insulation layer;
   a floating support layer covering the second interlayer insulation layer, the floating support layer extending to contact a sidewall of the second blocking wall and to contact outer sidewalls of the second storage nodes;
   a third interlayer insulation layer covering the plate node and extending onto the second blocking wall and the floating support layer; and
   a third contact penetrating the third interlayer insulation layer to be connected to the second contact.

2. The semiconductor device of claim 1, wherein the first blocking wall includes the same material layer as the first storage nodes and the first contact.

3. The semiconductor device of claim 1, wherein the second blocking wall includes the same material layer as the second storage nodes and the second contact.

4. The semiconductor device of claim 3, wherein the second blocking wall includes a titanium (Ti) layer, a tantalum (Ta) layer, a tungsten (W) layer, a ruthenium (Ru) layer or a compound material thereof.

5. The semiconductor device of claim 1, wherein the floating support layer includes a silicon nitride layer different from the first, second and third interlayer insulation layers.

6. The semiconductor device of claim 1, further comprising a blocking layer disposed between the first and second interlayer insulation layers,
wherein the blocking layer extends to cover the first blocking wall and separates the first interlayer insulation layer.

7. The semiconductor device of claim 6, wherein the blocking layer includes a silicon nitride layer different from the first and second interlayer insulation layers.

* * * * *